United States Patent [19]

Maston, III et al.

[11] Patent Number: 5,080,228

[45] Date of Patent: Jan. 14, 1992

[54] INTEGRAL CARRIER AND SYSTEM FOR ELECTRICAL COMPONENTS

[75] Inventors: Roy E. Maston, III, Milford; Robert H. Murphy, Merrimack, both of N.H.

[73] Assignee: R. H. Murphy Co., Inc., Amherst, N.H.

[21] Appl. No.: 634,898

[22] Filed: Dec. 27, 1990

[51] Int. Cl.[5] .................. B65D 81/00; B65D 83/00
[52] U.S. Cl. ................................ 206/331; 206/328
[58] Field of Search .................. 206/328, 329, 334

[56] References Cited

U.S. PATENT DOCUMENTS

| | | | |
|---|---|---|---|
| 4,615,441 | 10/1986 | Nakamura | 206/334 X |
| 4,620,632 | 11/1986 | Alemanni | 206/329 |
| 4,681,221 | 7/1987 | Chickanosky et al. | 206/328 |
| 4,706,161 | 11/1987 | Buckingham | 206/331 |
| 4,715,835 | 12/1987 | Matsuoka | 206/328 X |
| 4,765,471 | 8/1988 | Murphy | 206/331 X |
| 4,991,714 | 2/1991 | Clatanoff | 206/328 X |
| 5,000,697 | 3/1991 | Murphy | 206/331 X |

Primary Examiner—William I. Price
Attorney, Agent, or Firm—Pearson & Pearson

[57] ABSTRACT

A carrier system for facilitating the production of electrical assemblies with electrical components including a component carrier and a fixture for facilitating component insertion and removal with the carrier. The carrier comprises an open rectangular peripheral skirt with a transverse support plate for engaging a component housing. Spaced flexible bowed retaining arms extend across the peripheral skirt. Each arm has a clip extension for securing the component housing in the carrier. Central operating structures on each retaining arm facilitate movement between first and second positions. Slide tabs on each arm coact with the peripheral skirt to prevent rotation of the retaining arms during motion. Operating tabs are spaced at fixed positions relative to the peripheral skirt. Supporting plates interconnect each tab to a respective operating arm that is positioned within the peripheral skirt as a function of component housing size. The system also includes a fixture that deflects the operating tabs as a carrier moves through the fixture.

22 Claims, 5 Drawing Sheets

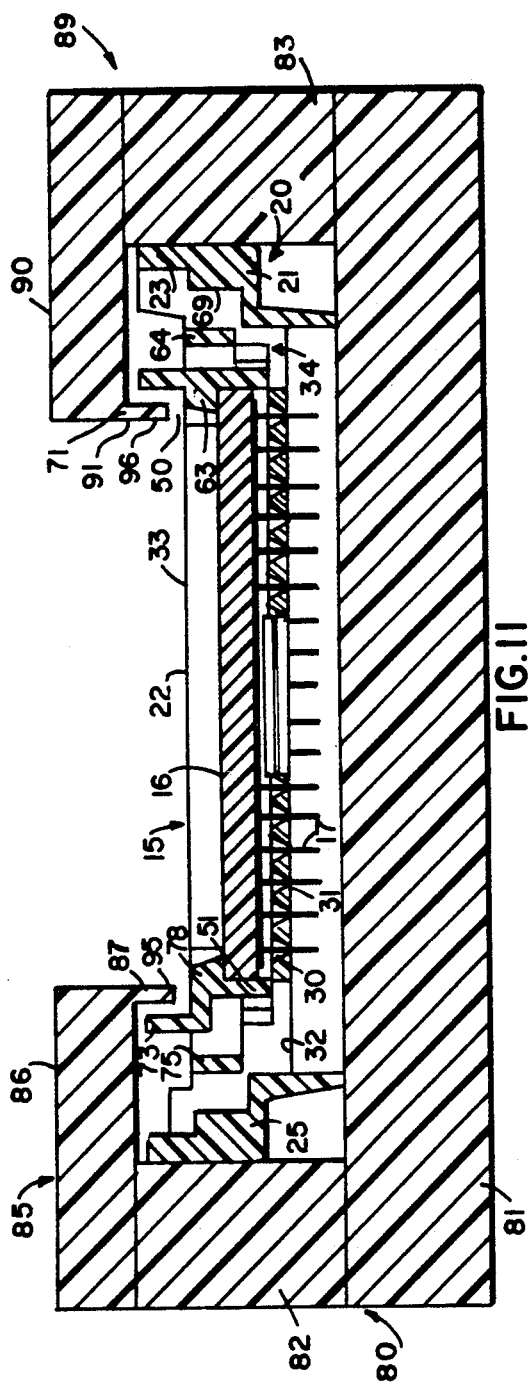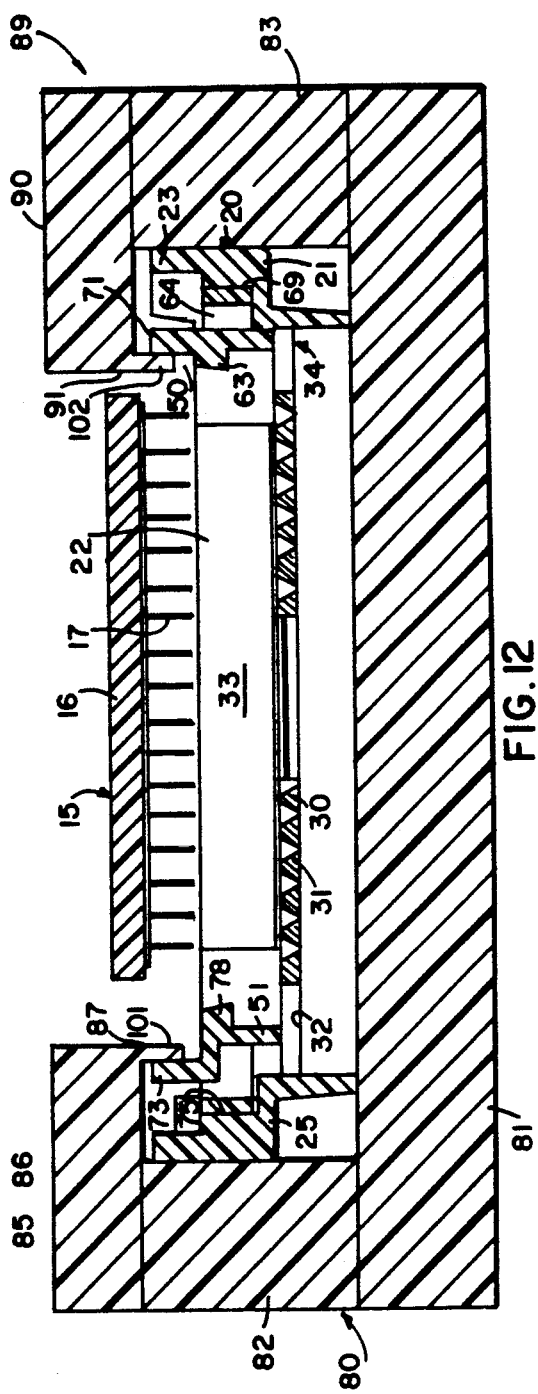

INTEGRAL CARRIER AND SYSTEM FOR ELECTRICAL COMPONENTS

BACKGROUND OF THE INVENTION

1. Field of the Invention

This invention generally relates to component carriers and more specifically to a system for facilitating the handling of electronic components in integrated circuit packages during the assembly production of electrical circuit assemblies.

2. Description of Related Art

Semiconductor devices have matured from simple circuit elements into complex components provided in a variety of integrated circuit packages. For example, pin grid array (PGA) components have a large number of terminals, can be quite expensive and typically occupy positions on a single circuit board with other PGA components. This maturation has been accompanied by an increase in the complexity of handling these components during assembly and testing operations.

PGA and similar components are more susceptible to damage from a number of external influences, such as mechanical shock and discharges of accumulated electrostatic charge, than were prior components. The consequence of potential damage and other factors has led to changes in transportation, assembly and testing procedures that utilize such components. Indeed, procedures for handling the components now contribute significantly to the success of electronic assembly production.

For example, when electronic components comprised simple transistors, resistors and capacitors, all the components would be assembled on a board without prior testing. If a component failed, simple debugging procedures isolated the defective components for replacement. Now it no longer is economically feasible to replace single PGA and other integrated circuit and similar components if they are mounted on a board. It is easier to discard the entire board with a number of valuable working components than it is to replace a single failed integrated circuit. Thus, present procedures involve component testing prior to assembly to minimize the risk of mounting a defective component. Although this adds costs to the assembly process, overall the added costs are less than those encountered when a board is assembled with a defective component and discarded.

The need to protect and test integrated circuits during assembly operations has led to the development of chip carriers. Chip carriers are special enclosures or packages that house and protect an integrated circuit or the like during processing, production, testing and assembly operations. Over time customers have evolved a number of desirable characteristics for chip carriers. For example, a chip carrier should orient an integrated circuit during the production process and assure proper placement and alignment of terminals for testing and for insertion into a printed circuit board. It should eliminate stresses from the terminals and seals found in such integrated circuits. Chip carriers also should protect a component from mechanical and electrical damage and provide access to all the terminals to facilitate component testing. As the number of circuit designs and packages have proliferated, so have the number of chip carrier configurations. Some of these different chip carrier structures satisfy all of these desirable characteristics necessary for transporting electronic circuits; others satisfy some of them.

In addition to the foregoing, a chip carrier should adapt to automated processing techniques. As a chip carrier transfers along an automated production system, its orientation in space often changes so the chip carrier must include a structure to secure or retain the electronic component in the carrier in a positive manner. However, some mechanisms, such as tooling or fixtures, must insert, remove or reposition such a structure in order to load or unload an integrated circuit component.

The following U.S. Letters Patent are examples of chip carrier structures that have discrete retention structures for securing a component in a chip carrier:
U.S. Pat. No. 4,765,471 (1988) Murphy
U.S. Pat. No. 5,000,697 (1991) Murphy The Murphy-471 patent, that is assigned to the same assignee as the present invention, discloses a chip carrier with an outer frame and a centrally disposed plate having conductive and non-conductive laminations. Apertures through the laminated plate receive PGA terminals and isolate them from each other and the conductive layers of the plate to facilitate testing. The outer frame about the periphery of the plate protects the component and its terminals from mechanical damage. Locking posts at opposite ends of the carrier engage latches on a discrete retainer to secure the retainer plate to the frame. A plurality of cantilevered arms adjacent a central opening through the retainer secure the PGA component against the laminated plates.

In the Murphy-697 patent, that is assigned to the same assignee as the present invention, a PGA carrier has a planar plate for supporting a pin grid array component. A transverse peripheral skirt around the edge of the plate defines upper and lower nested cavities that protect the component housing and the terminal pins respectively. Shock absorbing means extend across one or both of two parallel ends of the peripheral skirt to absorb impact stresses that can occur during transport. The edges of the plate and a removable retaining means have engagement means that secure the retaining means to the carrier. The retaining means overlies the component and secures it in the chip carrier.

The following U. S. Letters Patent describe chip carriers with integrally formed retention devices:
U.S. Pat. No. 4,615,441 1 (1986) Nakamura
U.S. Pat. No. 4,620,632 (1986) Alemanni
U.S. Pat. No. 4,681,221 (1987) Chickanosky et al
U.S. Pat. No. 4,706,161 (1987) Buckingham
U.S. Pat. No. 4,715,835 (1987) Matsuoka Nakamura discloses a chip carrier with means for supporting an integrated circuit or similar component. A press plate pivots on the carrier to secure the component in the carrier.

Alemanni discloses a chip carrier with separate inserts for supporting differently configured electronic components. Each insert has integral retention fingers with inward projections that overlap the housing. The retention fingers bend outwardly from edges of the housing under application of an external bending force generally in the plane of the carrier. This provides clearance for the insertion of the component. When the fingers are released, they immediately move or relax to normal positions in which flanges on the fingers overlie the component housing and secure it to the carrier insert. Similar retention fingers secure the insert to the chip carrier.

The Chickanosky et al patent discloses a single-piece holder or chip carrier for an electronic component with two flexible over-center snap-acting arms. In a first position the arms open a cavity defined by a peripheral skirt and an internal component support structure. When a component has been deposited on the support structure, the arms are deflected inwardly over center to snap to a second position. In this position the arms overlie the component and secure it in the carrier.

Buckingham discloses a chip carrier with a base member and a cover that pivots on the base member. Various inserts form about the electronic component and lie on the base member. The cover pivots to lock all the inserts to the base member.

Matsuoka discloses a chip carrier with a structure for supporting an electronic component on a base. A cover defines a window for exposing the electronic component to the outside. The cover can snap into a locked position thereby to positively retain the electronic component in the carrier.

These systems can be difficult or cumbersome to utilize in fully automated production lines. In the Murphy-471 patent, for example, the locking posts that secure the retention cover deflect along the axis of motion. It therefore is often necessary to stop chip carrier motion along a production line to release the cover. The Murphy-697 patent discloses a system that is adapted to automated production facilities, particularly for facilitating the removal of the retaining means as the chip carrier moves along a production line, but not the insertion. Further, both systems require handling of the separate retention means.

The Chickanosky patent discloses a system with integral retention means in the form of flexible snap acting arms. However, the chip carrier is dependent upon the size of the component itself and each different carrier has a different outline. Further, arm deflection occurs in the same line as an axis of motion and requires oppositely directed faces. These requirements complicate production. Although the Nakamura, Alemanni, Buckingham and Matsuoka patents disclose carriers that have integral retention means, they also complicate production tooling. For example, the chip carrier shown in the Alemanni patent requires special tooling for spreading four retention fingers simultaneously.

SUMMARY

Therefore, it is an object of this invention to provide a carrier for an electrical component with a standard outline that is readily adapted to carry electronic components in a variety of sizes.

Another object of this invention is to provide a carrier for an electrical component with integral component retention means adapted for automated processing.

Yet another object of this invention is to provide a carrier for an electrical component with integral component retention means that facilitates both the insertion and removal of the component in automated processing.

Still another object of this invention is to provide carriers for electronic components of distinct sizes with a structure that enables a single insertion and removal tool to coact with all the sizes.

Yet still another object of this invention is to provide a carrier pin grid structure particularly adapted for array integrated circuit components that supports the component, makes the terminal pins available for testing, captures the component in the unit, provides electrostatic protection and protection against mechanical shock and is adapted for automated processing techniques.

In accordance with one aspect of this invention, a carrier for an electronic component has a peripheral skirt means including spaced parallel skirts and a planar support for the component. Spaced bowed retaining arms extend between certain of the parallel skirts and deflect between first and second positions In the second position, a component can be inserted onto the planar support. When the retained arms return toward the first position, clip means on the spaced bowed retaining arms overlap the electronic component thereby to secure it in the carrier. Operating means facilitate the deflection of the retaining arms to the second position.

In accordance with another aspect of this invention, a system includes a carrier as described above cooperates with an insertion/removal fixture including a frame, channels for guiding each carrier through the frame and means on the frame for engaging the operating means thereby to deflect the carrier retaining arms to their second positions. In this connection, the arrangement and spacing of the bowed arms and the operating means enable a single set of engagement means to engage operating means in carriers for differently sized components.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 11 is a cross-section view taken along lines 11—11 in FIG. 9 with a carrier in a position of minimum retaining means deflection;

FIG. 12 is a cross-section view taken generally along lines 11—11 in FIG. 9 with a carrier in a position of maximum retaining means deflection;

DESCRIPTION OF ILLUSTRATIVE EMBODIMENTS

Figure 3:
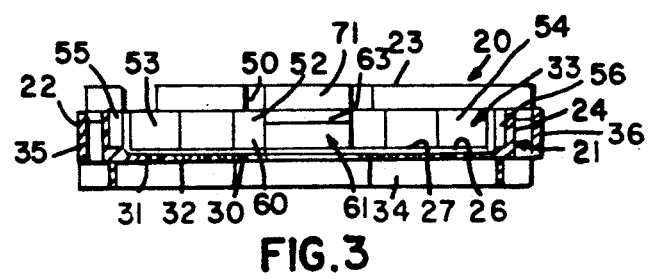
FIG. 3 is a cross-section view taken along lines 3—3 in FIG. 2.
Figure 4:
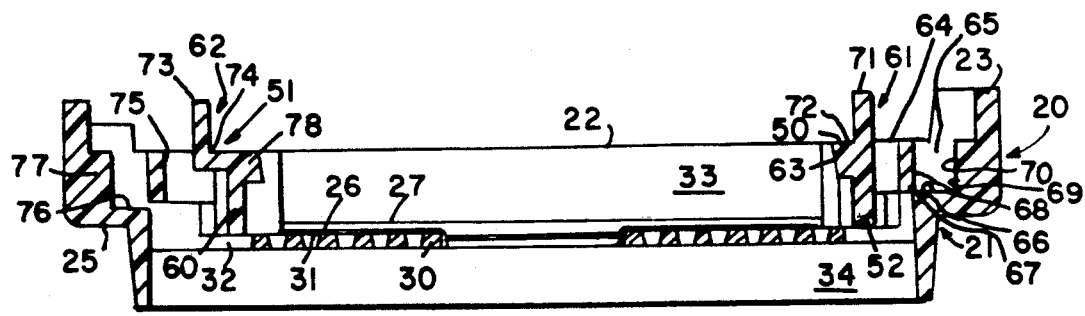
FIG. 4 is a cross-section view taken generally along lines 4—4 in FIG. 2 with retaining means in a relaxed condition.
Figure 5:
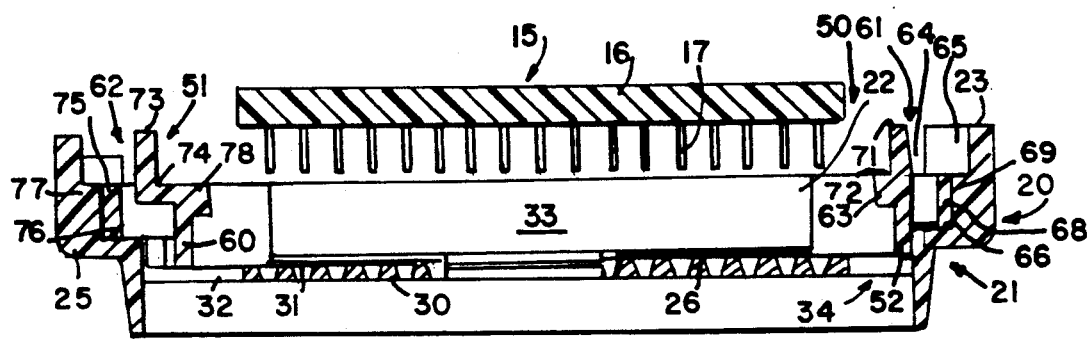
FIG. 5 is a cross-section view taken generally along lines 4—4 in FIG. 2 with the retaining structure deflected and an electronic component displaced from the carrier.
Figure 6:
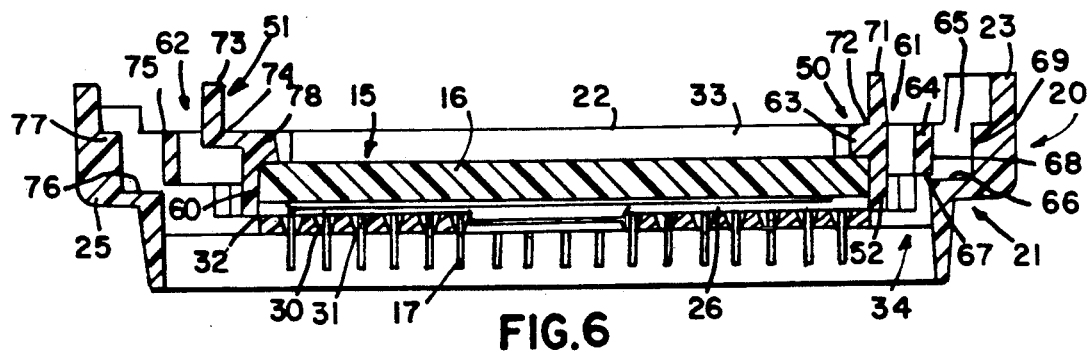
FIG. 6 is a cross-section view taken generally along lines 4—4 in FIG. 2 that depicts the structure in FIG. 5 as the retaining means secures a component in the carrier.
Figure 7:
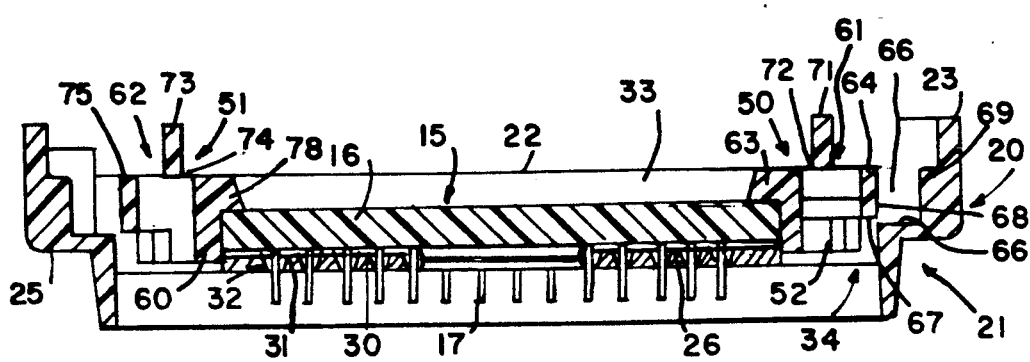
FIG. 7 is a cross-section view similar that shown in FIG. 6 for an electronic component having a smaller housing.

Referring to FIGS. 1 through 7, particularly FIGS. 5 through 7, this invention is useful in connection with the transportation, handling and testing of a variety of electronic components. For purposes of this explanation, however, this description is limited to carriers useful in the transportation, handling and testing of pin grid array (PGA) integrated circuits 15. As shown in FIGS. 5 through 7, a PGA integrated circuit typically comprises a ceramic planar square housing 16 and an array of terminals 17 that depend from the planar body portion 16. As will become apparent, however, this invention is useful with a number of similarly formed components, such as other circuit components formed in the so-called PGA or similar packages having rectangular, including square, housings and arrays of terminals that depend from or are in plane with the housing.

Figure 1:
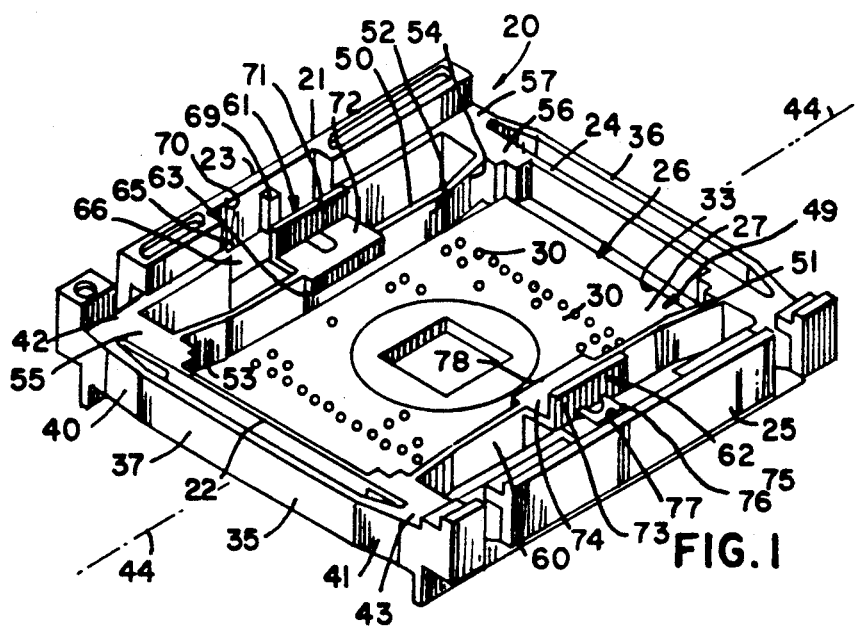
FIG. 1 is a perspective view of a carrier for an electronic component constructed in accordance with this invention.
Figure 2:
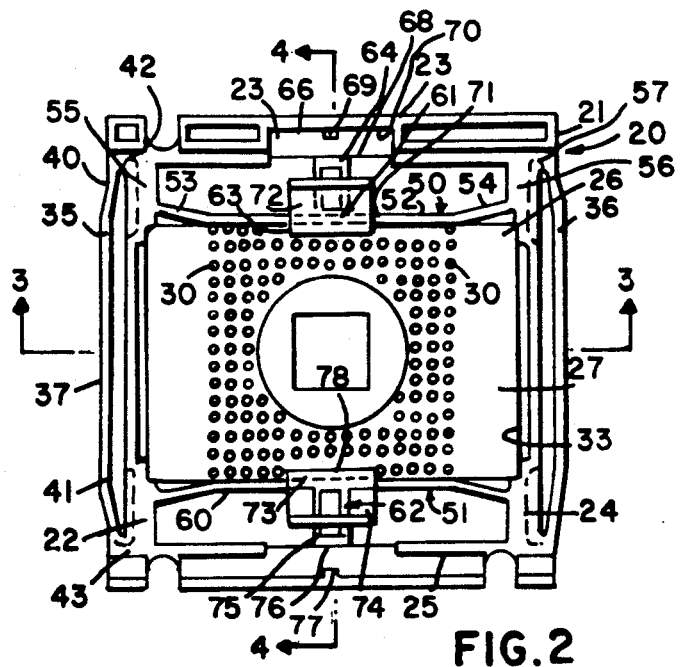
FIG. 2 is a top plan view of the carrier shown in FIG. 1.

Referring now to FIGS. 1 through 7 and particularly FIGS. 1 through 3, a chip carrier 20 according to this invention has an outer or peripheral rectangular conductive frame or peripheral skirt 21 for defining the periphery of the carrier and constituting a supporting frame. The peripheral skirt 21 comprises four skirts 22 through 25 that form a square frame in this embodiment. A planar insulating plate 26 with an upper surface 27 and a plurality of apertures 30 therethrough supports the housing 16 shown in FIGS. 5 through 7. A bottom surface 31 on the plate 26 contacts a conductive plate 32 that attaches to the skirts 22 and 24 about midway on the skirts in elevation. The peripheral skirt 21 and the insulating and conductive plates 26 and 32 thereby define an upper cavity 33 and a lower cavity 34. The upper cavity 33 protects the integrated circuit housing 16 from damage; the lower cavity 34 minimizes potential damage to any terminals, such as terminals 17, extending below the plates 26 and 32.

FIGS. 1 and 2 also depict bumpers 35 and 36 that are spaced from and lie outside the skirts 22 and 24 respectively. The bumpers 35 and 36 have a similar construction. By way of example, the bumper 35 comprises a central portion 37 and offsetting end portions 40 and 41 that are short with respect to the central portion 37 and that space the central portion 37 parallel to the skirt 22. The end portions 40 and 41 join the carrier frame section 21 at corners 42 and 43, respectively.

The bumpers 35 and 36 are integral with the conductive frame 21 and comprise thin webs of conductive plastic material so the central section 37 is resilient and deflects under the application of force along a motion axis 44. This deflection and deformation dissipates the forces introduced by shock and minimizes the resultant forces applied to a component in the chip carrier 20.

More specifically, a chip carrier as shown in FIGS. 1 and 2 normally travels along a path corresponding to the axis 44. Any shocks imparted along the axis 44, particularly as one chip carrier 20 strikes another during transport or handling cause the bumpers 35 and 36 to flex. This dissipates energy and minimizes any transfer of shock forces to the PGA component in the carrier 20. The bumpers 35 and 36 are, however, optional. That is, a chip carrier assembly may also have a single bumper such as bumper 35 or no bumpers.

The carrier 20 therefore incorporates a number of the desirable features of a chip carrier. The carrier supports an electronic component and protects it from adverse effects of mechanical shock. The combination of the non-conductive plate 26 and the conductive plate 32 acts to dissipate any electrostatic charges. The upper and lower cavities 33 and 34 mechanically isolate and protect the housing and terminal pins. The apertures through the insulating plate 26 typically have a smaller diameter than those through the conductive plate 32 to isolate electrically the terminals 17 from each other and from the conductive materials to facilitate testing in the chip carrier 20.

In accordance with the objects of this invention, the carrier 20 has integral retention means for locking an electronic component positively against the insulating plate 26. This integral retention means 49, as shown in FIGS. 1 through 7, comprises two flexible, bowed retaining arms 50 and 51. Skirts 22 and 24 support the arms 50 and 51 in generally parallel, symmetrical positions with the bow in each of the arms 50 and 51 extending toward the center of the carrier 20 (i.e., the axis 44). Each retaining arm has a similar structure including, with respect to the retaining arm 50, a slightly bowed center span 52 supported between offsets 53 and 54. A fillet 55 at the corner 42 connects to the offset 53 while a fillet 56 at the opposite corner 57 connects to the offset 54.

As shown in FIG. 1, the arms 50 and 51, with their bowed appearance in a relaxed position, can flex toward the skirts 23 and 25, respectively. As such flexure occurs, stresses build within the materials and produce a restoring force for displacing the arms 50 and 51 back to the position shown in FIG. 1 when the arms 50 and 51 are released.

The spacing between the arms 50 and 51 and the size of fillets 55 and 56 are determined by the housing size of the electronic component the carrier supports. There are a standard number PGA component sizes so the number of different carriers and configurations is finite. Basically, the spacing between the center span 52 on arm 50 and a center span 60 on arm 51 corresponds to the dimension across a housing 16. Referring specifically to FIGS. 1, 2, and 4, each of the arms 50 and 51 supports a center structure 61 or 62 respectively at midpoints along their lengths. The structure 61, by way of example, has a horizontal clip extension 63 that extends toward the retaining arm 51. As shown in FIG. 6, this clip extension 63 overlies the electronic component housing 16 thereby to secure the housing 16 against the insulating plate 26.

A slide tab 64 extends outwardly from the retaining arm 50 toward the skirt 23. The slide tab 64 terminates horizontally at the edge of a central cavity 65 in the skirt 23 that has a horizontal surface 66 in approximately the same plane as a bottom surface 67 of the slide tab 64. An end 68 of the slide tab 64 aligns with a stop 69 formed on the vertical wall 70 of the central cavity 65. A vertical operating tab 71 extends from the central section of the retaining arm 50 supported by a horizontal plate 72. A similar vertical operating tab 73 extends from a support 74 at the center of the retaining arm 51. Thus the vertical operating tabs 71 and 73 constitute operating means that enable an operator of tooling to displace the retaining arms 50 and 51 toward the skirts 23 and 25 respectively. Deflection of the retaining arm 50 continues until the end surface 67 engages the stop 69. Likewise deflection of the retaining arm 51 continues until an end surface 76 on the slide tab 75 engages a stop 77.

The application of deflecting forces to the vertical operating tabs 71 and 73 introduces moments about longitudinal axes through the retaining arms 50 and 51 that tend to rotate the vertical tabs 71 and 73 downwardly. However, as the arms 50 and 51 deflect, the slide tab, such as slide tab 64 on arm 50, overlaps the surface 66 in the central cavity 65 and blocks any rotation that could otherwise occur with the moment applied.

When the retaining arms 50 and 51 fully deflect, there is sufficient clearance between the clip extension 63 and a similar extension 78 on the arm 51 to permit a correspondingly sized PGA component housing to pass between the ends of the clip extensions 63 and 78. When PGA component is properly inserted, releasing the deflecting force from the operating tabs 71 and 73 enables the retaining arms 50 and 51 to relax toward the center until the center sections 52 and 60 abut the sides of the housing 16 and the clip extensions 63 and 78 overlie a portion of the top of the housing 16. In this position there still is some residual stress and restoring force that causes the arms 50 and 51 to apply pressure against the housing 16. As a result the retaining arms 50 and 51 maintain positive contact with the housing 16 even during vibration or shock transverse to the axis 44 shown in FIG. 1. Moreover, when a PGA component is contained in the carrier 20, the retaining arms 50 and 51 position the slide tabs 64 and 75 over the horizontal surfaces 66 and 76. This overlap prevents rotational movement of the retaining arms 50 and 51 that otherwise could allow the clip extensions 63 and 78 to disengage from the PGA component if a shock, applied to the carrier 20, were to introduce a moment about the axes of the retaining arms 50 and 51 that parallel the axis 44.

As will be apparent a similar sequence facilitates removal of a PGA or like component from the carrier 20. That is, a fixture or other tooling engages the vertical tabs 71 and 73 and deflects the retaining arms 50 and 51 toward their respective skirts 23 and 25. When the retaining arms 50 and 51 are fully deflected, the component can be easily removed. Then the deflecting force is removed so the arms return to a fully relaxed position as shown in FIG. 4.

FIG. 7 discloses a carrier constructed for a PGA component having a different physical size than the component shown in FIGS. 5 and 6. With particular reference to FIGS. 6 and 7, both the vertical tabs 71 in FIGS. 6 and 7 and vertical tabs 73 in FIGS. 6 and 7 align vertically with respect to each other, notwithstanding the different housing sizes and the corresponding different positions of the retaining arm 52 in FIGS. 6 and 7. More specifically, as described above, the vertical operating tab 71 is part of an L-shaped structure with the plate 72. The plate 72 acts as an offset plate that supports the vertical tab 71 from the arm 50. A similar offset plate 74 controls the spacing of the operating tab 73 relative to the arm 51. The size of the housing 16 determines the amount of offset. Thus, regardless of the size of the component housing, the operating tabs 71 and 73 are spaced inwardly from the periphery of the carrier 20 by equal and constant distances. This structure enables a single fixture to facilitate insertion and removal with carriers of a given outline, notwithstanding the size of the component in the carrier.

FIGS. 8 through 12 disclose such a fixture 80. As particularly shown in FIGS. 8 through 10, this fixture 80 typically includes a horizontal base 81 that lies along the axis of motion 44 at the edges of the base 81. Side beams 82 and 83 parallel the axis 44. The nominal spacing between these beams corresponds to the overall dimension of the carrier between the outer surfaces of the skirts 23 and 25. Flared sections 84 at each of the ends of the beams 82 and 83 facilitate the insertion of the carrier. As a carrier advances into the fixture 80, the bottom of the carrier initially slides over the base 81 and is centered by the flared sections 84 to be positioned horizontally between the beams 82 and 83.

The beam 82 supports an L-shaped structure 85 with a plate 86 parallel to and spaced above the base 81 and a depending lip structure 87 extending from the edge of the plate 86 toward the base 81. The beam 83 supports a similar L-shaped structure 89 comprising a plate 90 and a lip structure 91. The plates 86 and 90 and lip structures 87 and 91 have different spacings along the axis 44. The lip structures 86 and 91 have adjacent an end 92, counterfacing end sections 95 and 96 that have closest spacing. Adjacent ramp sections 97 and 98 ramp outwardly in a horizontal plane to central sections 101 and 102. The sections 101 and 102 have a maximum spacing between them. The lip structures 86 and 91 are symmetrical and have ramping sections 103 and 104 and end sections 105 and 106.

Figure 8:
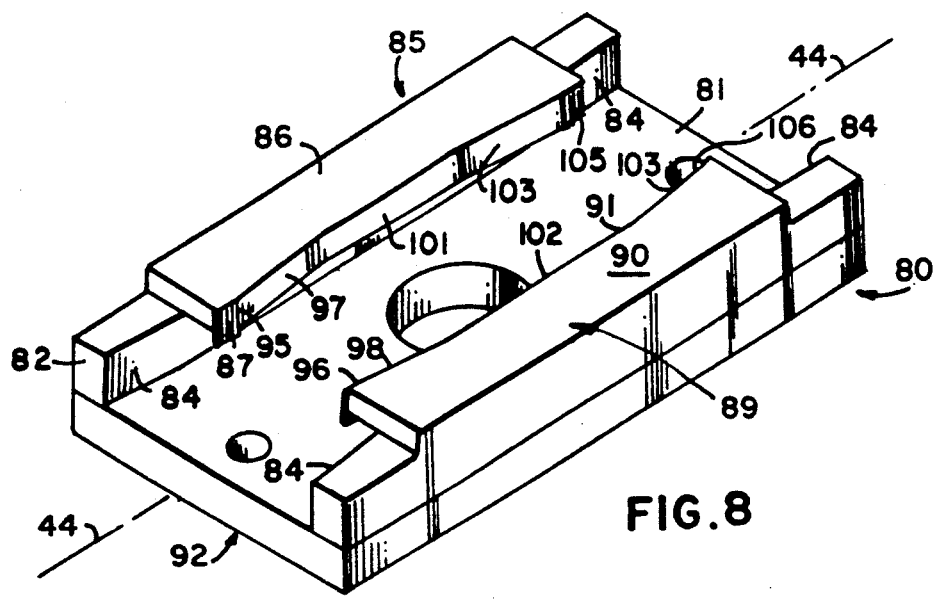
FIG. 8 is a perspective view of an insert/removal fixture constructed in accordance with another aspect of this invention.
Figure 9:
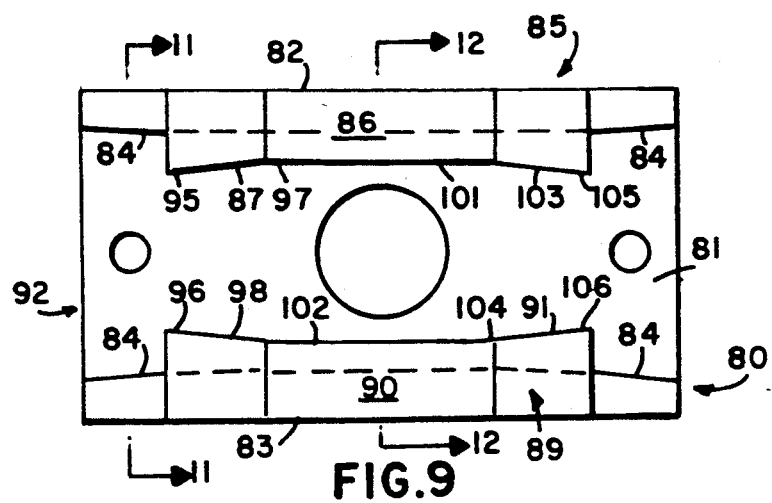
FIG. 9 is a top view of the insert/removal fixture shown in FIG. 8.
Figure 10:
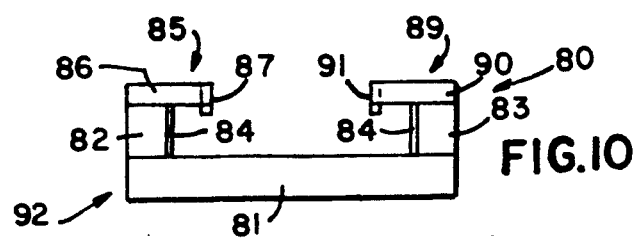
FIG. 10 is an end view of the insert/removal fixture shown in FIG. 8.

Referring now to FIGS. 8 and 11, as a carrier 20 travels into the fixture 80, the lip sections 95 and 96 eventually overlap the vertical operators 71 and 73. However, the spacing between the lip sections 95 and 96 is selected so that they initially do not deflect the operators 71 and 73. As the carrier travels along the axis 44, the operators 71 and 73 engage the lip sections 96 and 97 and the ramped lip sections 97 and 98 then deflect the operators 71 and 73 horizontally toward the skirts 23 and 25. When the operator 71 and 73 reach the center section of the fixture 80 as shown in FIG. 12, the lip sections 101 and 102 fully deflect the operators 71 and 73. Thus it is possible either to insert either a component as shown in FIGS. 5 and 6 or to remove a component from the carrier. Further motion along the axis 44 then allows the operator 71 and 72 to pass by the ramp sections 103 and 104 whereupon the deflecting force eases and the arms eventually return to a locking position as shown in FIGS. 6 and 7 when the operators 71 and 73 exit the end sections 105 and 106.

From the foregoing description it will be apparent that the fixture shown in FIG. 8 is symmetrical so that it operates equally whether the carrier moves into the fixture from the end 92 or from the opposite end. This fixture and the structure of the carrier facilitate automated production operations. Robotic devices or other fixtures can position a carrier in the center. Then robotic or other devices can remove or insert the PGA or like component in the carrier. The robot or other device can then move the carrier out of the fixture.

Figure 13:
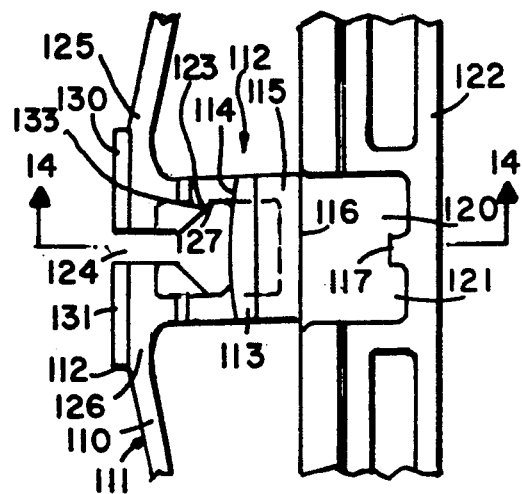
FIG. 13 is a top view of an alternative embodiment of a central structure constructed in accordance with this invention.
Figure 14:
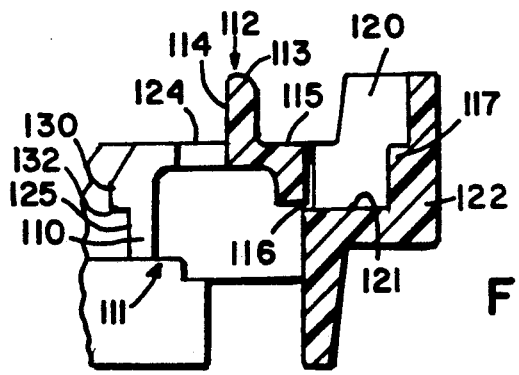
FIG. 14 is a section taken along lines 14—14 of FIG. 13.

FIGS. 13 and 14 depict an alternative embodiment of the central structures 61 and 62 in FIGS. 1 through 7 that enhances flexibility and allows greater displacement of the bowed retaining arms. Center sections 110 of a retaining arm 111 carry this alternative central structure 112. The central structure 112 has a vertical operating tab 113 with a rounded or tapered surface 114 to facilitate the engagement of portions of a fixture such as the lips 87 and 91 in FIG. 8 A slide tab 115 extends outwardly from the vertical tab 113 and has an end surface 116 for engaging a stop 117. The stop 117 is centrally disposed in a cavity 120 with a bottom surface 121, all being formed in one of the peripheral skirts 122. When the retaining arm 111 deflects toward the skirt 122, the slide tab 115 slides over the surface 121 and prevents any rotation of the retaining arm 111.

In accordance with this embodiment, the central structure 112 has a support plate 123 that is split along an axis 124 to define spaced sections 125 and 126 in the central structure 112 about a slot 127. The sections 125 and 126 carry, respectively, clip extensions 130 and 131. Each clip extension has an overhanging lip, FIG. 14 disclosing an overhanging lip 132 on the clip extension 125.

As the central structure 112 moves toward the stop 117, an enlarged central aperture 133 in the support plate 123, that defines two hinge points, allows the slot 127 to close as the central structure moves toward the stop 117. This improves the overall flexibility of the retaining arm 111 and provides flexibility over a greater range of travel of the central structure 112. With such a structure it is possible for a given carrier to handle a limited range of electronic component sizes.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A carrier for an electrical component with a planar housing of predetermined dimensions, said carrier comprising:
   A. first spaced parallel skirt means and second skirt means for connecting said first set of skirt means to form peripheral skirt means,
   B. planar support means for supporting the planar housing of the electrical component, said planar support means extending between said first skirt means at an intermediate plane through said peripheral skirt means thereby forming first and second cavities,
   C. retaining means between said first skirt means in said first cavity and spaced from said second skirt means for deflection between first and second positions,
   D. inwardly extending clip means on each of said retaining means for capturing the component housing when said retaining arm means are in the first position, and
   E. operating means on each said retaining means for facilitating the deflection of said retaining means from the first position to the second position.

2. A carrier as described in claim 1 wherein the retaining means comprises flexible arms.

3. A carrier for an electrical component as recited in claim 2 adapted for traveling along a central axis transverse to said first skirt means wherein each flexible arm bowed toward the central axis.

4. A carrier for an electrical component as recited in claim 1 wherein said second skirt means include means for forming a skirt cavity spaced from said retaining means and having a surface parallel to said planar base means and said retaining means includes slide tab means for moving over said parallel surface as said retaining means moves to the second position thereby to prevent twisting of said retaining means and said clip means.

5. A carrier for an electrical component as recited in claim 4 wherein said second skirt means additionally includes stop means at said skirt cavity for defining the second position with said slide tab means.

6. A carrier for an electrical component as recited in claim 1 wherein said operating means comprises operating tab means for receiving a force to move said retaining means to the second position and offset means connected to said retaining means and said operating tab means for positioning said operating tab means independently of the position of said retaining means and at a constant position relative to said peripheral skirt means.

7. A carrier for an electrical component as recited in claim 6 said offset means on each retaining means locate a corresponding one of said operating tab means at a different position relative to said retaining means and at a predetermined position with respect to said peripheral skirt means.

8. A carrier for an electrical component as recited in claim 6 wherein said second skirt means include means for forming a skirt cavity spaced from said retaining means and having a surface parallel to said planar base means and said retaining means includes slide tab means for moving over said parallel surface as said retaining means moves to the second position thereby to prevent twisting of said retaining means and said clip means.

9. A carrier for an electrical component as recited in claim 6 wherein said second skirt means additionally includes stop means for defining the second position with said slide tab means.

10. A carrier for an electrical component as recited in claim 6 adapted for traveling along a central axis transverse to said first skirt means wherein each of said retaining means bows toward the central axis.

11. A carrier for an integrated circuit in a pin grid array package characterized by a planar housing of predetermined dimensions and an array of depending terminals, said carrier being adapted for transport along an axis and comprising:
   A. first and second spaced parallel skirt means for forming a rectangular peripheral skirt means that defines the outline of said carrier, said first and second skirt means lying transverse to and parallel to the axis, respectively,
   B. planar support means for supporting the planar housing of the electrical component, said planar support means extending between said first skirt means at an intermediate plane through said peripheral skirt means thereby forming first and second cavities and having a plurality of apertures therethrough for receiving the terminals of the integrated circuit,
   C. flexible bowed retaining arm means attached to said first skirt means and spaced from said second skirt means in said first cavity for deflection between first and second positions, each said retaining arm means being bowed toward the axis,
   D. inwardly extending clip means on each of said retaining arm means for capturing the component housing when said retaining arm means are in the first position, and
   E. operating means on each said retaining arm means for facilitating the deflection of said retaining arm means from the first position to the second position.

12. A carrier for an electrical component as recited in claim 11 wherein said second skirt means include means for forming a skirt cavity spaced from said retaining arm means and having a surface parallel to said planar base means and said retaining arm means includes slide tab means for moving over said parallel surface as said retaining arm means moves to the second position thereby to prevent twisting of said retaining arm means and said clip means.

13. A carrier for an electrical component as recited in claim 12 wherein said second skirt means additionally includes stop means at said skirt cavity for defining the second position with said slide tab means.

14. A carrier for an electrical component as recited in claim 13 wherein said operating means comprises operating tab means for receiving a force to move said retaining arm means to the second position and offset means connected to said retaining arm means and said operating tab means for positioning said operating tab means independently of the position of said retaining arm means and at a constant position relative to said peripheral skirt means.

15. A carrier for an electrical component as recited in claim 14 said offset means on each retaining arm means locate a corresponding one of said operating tab means at a different position relative to said retaining arm means and at a predetermined position with respect to said peripheral skirt means.

16. A carrier for an electrical component as recited in claim 14 wherein said second skirt means include means for forming a skirt cavity spaced from said retaining arm means and having a surface parallel to said planar base means and said retaining arm means includes slide tab means for moving over said parallel surface as said retaining arm means moves to the second position thereby to prevent twisting of said retaining arm means and said clip means.

17. A carrier for an electrical component as recited in claim 14 wherein said second skirt means additionally includes stop means for defining the second position with said slide tab means.

18. A carrier for an electrical component as recited in claim 14 wherein said planar support means comprises a laminated plate with an insulating laminate for contacting the housing and terminals of the integrated circuit and a conductive laminate in said second cavity contacting said insulating laminate.

19. A carrier for an electrical component as recited in claim 14 wherein at least one of said second skirt means has bumper means attached thereto for absorbing shocks imparted along the axis, each such bumper means being attached to said second skirt means and being spaced therefrom.

20. A system for use in the assembly of electrical components having planar housings of predetermined dimensions, said system comprising:
A. a carrier for each electrical component, said carrier including:
   i. first spaced parallel skirt means and second skirt means for connecting said first set of skirt means to form peripheral skirt means,
   ii. planar support means for supporting the planar housing of the electrical component, said planar support means extending between said first skirt means at an intermediate plane through said peripheral skirt means thereby forming first and second cavities,
   iii. flexible bowed retaining arm means between said first skirt means in said first cavity and spaced from said second skirt means for deflection between first and second positions,
   iv. inwardly extending clip means on each of said retaining arm means for capturing the component housing when said retaining arm means are in the first position, and
   v. operating means on each said retaining arm means for facilitating the deflection of said retaining arm means from the first position to the second position,
B. means for transferring said carrier along an axis, and
C. fixture means in line with said transfer means for facilitating the insertion and removal of an electrical component from a said carrier, said fixture means including:
   i. guide means for receiving said peripheral skirt means of a said carrier, and
   ii. means for engaging said operating means on each said retaining arm means for displacing said retaining arm means to the second position thereby to open said carrier for insertion and removal of the electrical component.

21. A system for use in the assembly of electrical components as recited in claim 20 wherein said guide means comprises a base plate means for support in said transfer means and spaced beam means parallel to the axis for engaging said peripheral skirt means and said engaging means comprises plate means on each said beam means for supporting depending lip means spaced above and transverse to said base plate means whereby said lip means engage said operating means on each said retaining arm means as a said carrier moves through said fixture means.

22. A system for use in the assembly of electrical components as recited in claim 20 wherein said operating means comprises operating tab means for contacting said lip means of said fixture means to move said retaining arm means to the second position and offset means connected to said retaining arm means and said operating tab means for positioning said operating tab means independently of the position of said retaining arm means and at a constant position relative to said peripheral skirt means and for positioning a corresponding one of said operating tab means at a different position relative to said retaining arm means whereby said fixture means engages said carriers for differently sized electronic components.

* * * * *